(12) United States Patent
Cheng et al.

(10) Patent No.: US 9,209,755 B2
(45) Date of Patent: Dec. 8, 2015

(54) OPERATIONAL AMPLIFYING DEVICE WITH AUTO-ADJUSTMENT OUTPUT IMPEDANCE

(71) Applicant: Orise Technology Co., Ltd., Hsinchu (TW)

(72) Inventors: Yen-Cheng Cheng, Hsinchu (TW); Chien-Chun Huang, Hsinchu (TW)

(73) Assignee: FOCALTECH SYSTEMS CO., LTD., Hsinchu (TW)

( * ) Notice: Subject to any disclaimer, the term of this patent is extended or adjusted under 35 U.S.C. 154(b) by 40 days.

(21) Appl. No.: 14/102,802

(22) Filed: Dec. 11, 2013

(65) Prior Publication Data

US 2014/0167847 A1 Jun. 19, 2014

(30) Foreign Application Priority Data

Dec. 14, 2012 (TW) .............................. 101147383 A

(51) Int. Cl.
*H03F 1/56* (2006.01)
*H03F 1/36* (2006.01)
*H03F 3/60* (2006.01)
*H03F 1/02* (2006.01)
*H03F 3/45* (2006.01)
*H03F 3/72* (2006.01)

(52) U.S. Cl.
CPC ................ *H03F 1/56* (2013.01); *H03F 1/0277* (2013.01); *H03F 1/36* (2013.01); *H03F 3/45475* (2013.01); *H03F 3/602* (2013.01); *H03F 3/72* (2013.01); *H03F 2200/387* (2013.01)

(58) Field of Classification Search
CPC ...... H03G 3/3026; H03G 3/3063; H03F 3/68; H03F 1/56; H03F 1/36; H03F 1/602; H03F 1/0277; H03F 3/45475; H03F 3/72; H03F 2200/387
USPC ............. 330/84, 124 D, 124 R, 144, 284, 295
See application file for complete search history.

(56) References Cited

U.S. PATENT DOCUMENTS

| | | | | |
|---|---|---|---|---|
| 5,387,879 A | * | 2/1995 | Satoh | 330/282 |
| 5,699,017 A | * | 12/1997 | Maejima | 330/280 |
| 7,843,261 B2 | * | 11/2010 | Schaffer | 330/86 |
| 2011/0187457 A1 | * | 8/2011 | Hsu et al. | 330/192 |
| 2012/0133439 A1 | * | 5/2012 | Lin | 330/260 |

* cited by examiner

*Primary Examiner* — Steven J Mottola
*Assistant Examiner* — Hafizur Rahman
(74) *Attorney, Agent, or Firm* — Bacon & Thomas, PLLC

(57) ABSTRACT

An operational amplifying device with auto-adjustment output impedance includes an operational amplifier and first to third signal paths. The operational amplifier has an output connected to its inverting input, and a non-inverting input for receiving an input signal. The first signal path has one end connected to the output of the operational amplifier and the other end connected to a first output node. The second signal path has one end connected to the output of the operational amplifier and the other end connected to the first output node. The third signal path has one end connected to the output of the operational amplifier and the other end connected to the first output node. The first signal path is normally on, and the second and third signal paths are normally off. The first signal path has high impedance, and each of the second and third signal paths has low impedance.

19 Claims, 11 Drawing Sheets

OPERATIONAL AMPLIFYING DEVICE WITH AUTO-ADJUSTMENT OUTPUT IMPEDANCE

BACKGROUND OF THE INVENTION

1. Field of the Invention

The present invention relates to the technical field of operational amplifiers and, more particularly, to an operational amplifying device with auto-adjustment output impedance.

2. Description of Related Art

The output of an operational amplifier typically has a frequency compensation to stabilize its closed-loop gain. Namely, a compensation resistor Rf is added to the output of the operational amplifier to increase the phase margin (PM). FIG. 1 is a schematic diagram of a typical operational amplifier with a compensation resistor. As shown in FIG. 1, the transfer function of the closed-loop voltage gain can be expressed as:

$$Av = \frac{Vout1}{Vin1}$$

$$= \frac{Vout}{Vin1} \times \frac{Vout1}{Vout}$$

$$= A \times \frac{R1 + \frac{1}{j\omega C1}}{Rf + R1 + \frac{1}{j\omega C1}}$$

$$= A \times \frac{1 + j\omega R1 C1}{1 + j\omega (Rf + R1) C1}$$

$$= A \times \frac{1 + \frac{f}{f_{Z1}}}{1 + \frac{f}{f_{P1}}}.$$

From the equation, it is known that the transfer function has one zero (with frequency $f_{Z1}$) and one pole (with frequency $f_{P1}$), which are $$\frac{1}{2\pi R1 C1}$$

and $$\frac{1}{2\pi (Rf + R1) C1},$$

respectively.

FIG. 2 shows a Bode plot of a large compensation resistor Rf, and FIG. 3 shows a Bode plot of a small compensation resistor Rf. As shown in FIG. 2, P1 and Z1 indicate a pole and a zero of RC output net in FIG. 1, respectively, and P2 and P3 indicate poles of the operational amplifier in FIG. 1, assuming that the zero and pole frequencies thereof have a relation of $f_{P1} < f_{P2} < f_{Z1} < f_{P3}$. When a large resistor Rf is selected, as shown in FIG. 2, it can be seen that the frequency of P1 becomes lower, so that only one pole P1 is present before 0 dB. From FIG. 2, PM=70° can be found, but the output Vout1 becomes slower. When a small resistor Rf is selected, as shown in FIG. 3, the frequency of P1 becomes higher so that only two poles P1 and P2 are present before 0 dB. From FIG. 3, PM=45° can be found, but the output Vout1 becomes faster, and the overshoot and undershoot may occur.

It can be observed from FIGS. 2 and 3 that, when a large resistor Rf is designed, the phase margin PM is larger while encountering a problem in that the output Vout1 is slower, and when a small resistor Rf is designed, the output Vout1 becomes faster, while encountering a problem in that the phase margin PM becomes smaller and the overshoot and undershoot may easily occur. For a design requirement of fast output and high stability, it is difficult to use such a resistor Rf compensation phase way to achieve the requirement. In addition, when resistor Rf is getting smaller, the operational amplifier requires additional Miller compensation or another compensation to increase the stability.

Therefore, it is desirable to provide an improved operational amplifier device to mitigate and/or obviate the aforementioned problems.

SUMMARY OF THE INVENTION

The object of the present invention is to provide an operational amplifying device with auto-adjustment output impedance, which allows the output of an operational amplifier to be fast responsive while the output signal has no overshoot and undershoot.

According to a feature, the present invention provides an operational amplifying device with auto-adjustment output impedance, which includes: an operational amplifier having an output connected to its inverting input, and a non-inverting input for receiving an input signal; a first signal path having one end connected to the output of the operational amplifier and the other end connected to a first output node; a second signal path having one end connected to the output of the operational amplifier and the other end connected to the first output node; and a third signal path having one end connected to the output of the operational amplifier and the other end connected to the first output node, wherein the first signal path is normally on, the second signal path and the third signal path is normally off, the first signal path has high impedance, and each of the second signal path and the third signal path has low impedance According to another feature, the present invention provides an operational amplifying device with auto-adjustment output impedance, which includes: an operational amplifier having an output connected to its inverting input, and a non-inverting input for receiving an input signal; 1-st to 2N-th signal paths having different impedance, each signal path having one end connected to the output of the operational amplifier and the other end connected to a first output node; and a control circuit connected to the non-inverting input, the 1-st to 2N-th signal paths, and the first output node for controlling the 1-st to 2N-th signal paths to be on or off, respectively, according to voltage of the output of the operational amplifier and voltage of the first output node.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
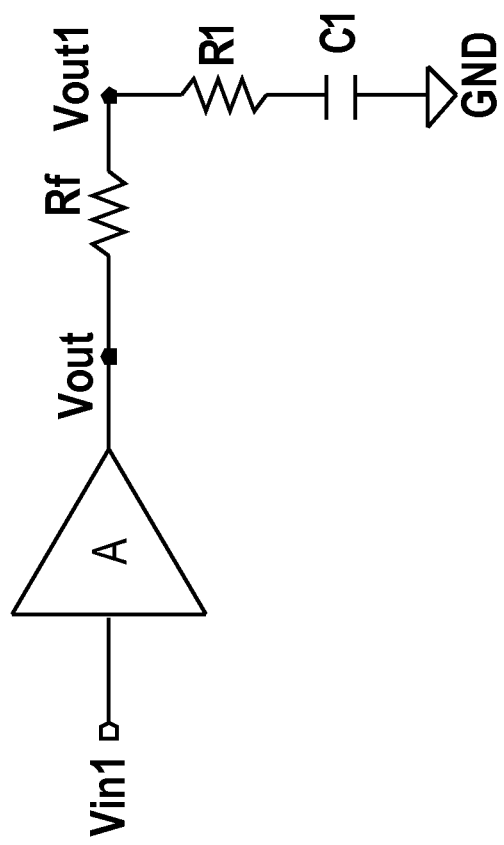
FIG. 1 is a schematic diagram of a typical operational amplifier with a compensation resistor.
Figure 2:
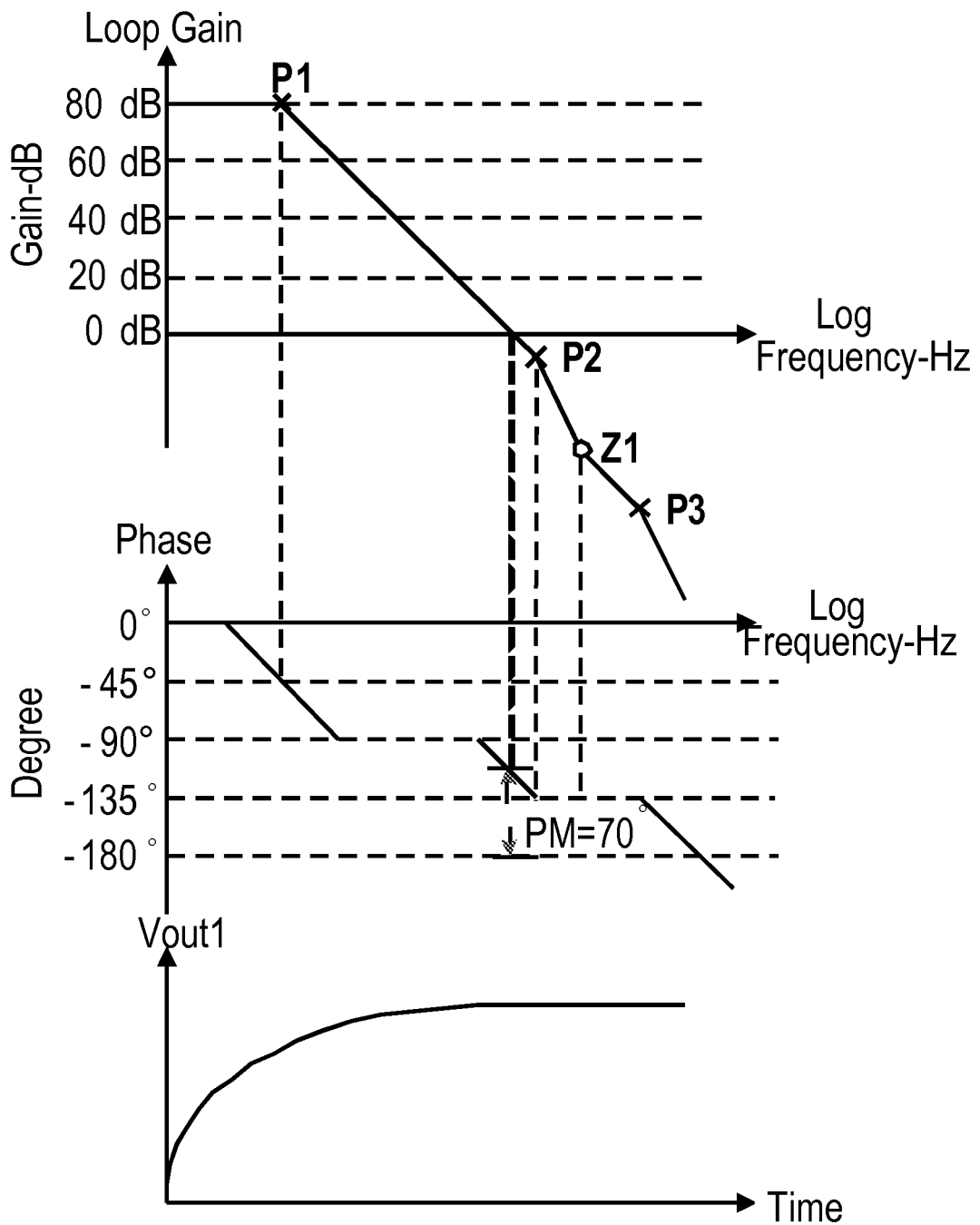
FIG. 2 shows a Bode plot of a large compensation resistor.
Figure 3:
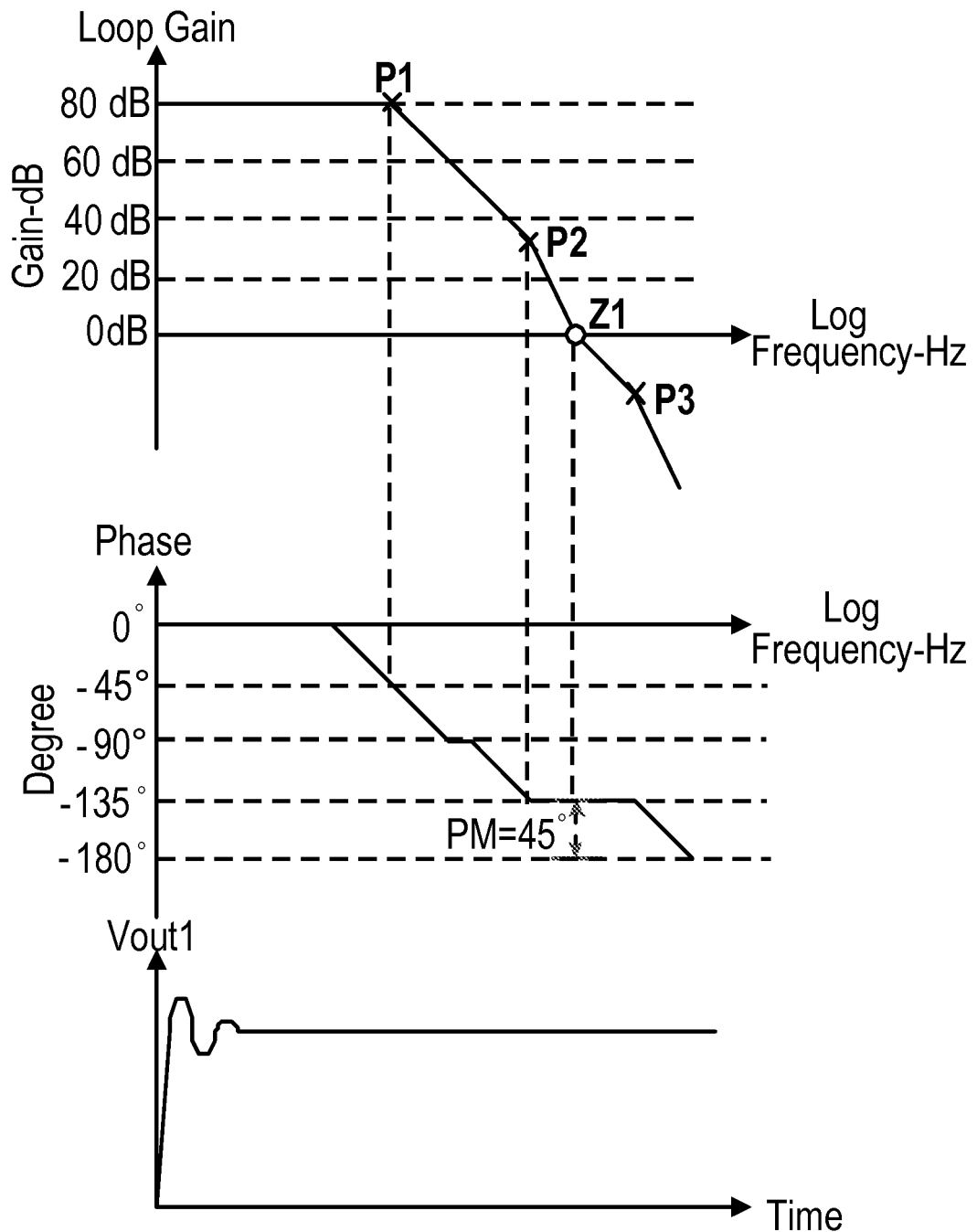
FIG. 3 shows a Bode plot of a small compensation resistor
Figure 4:
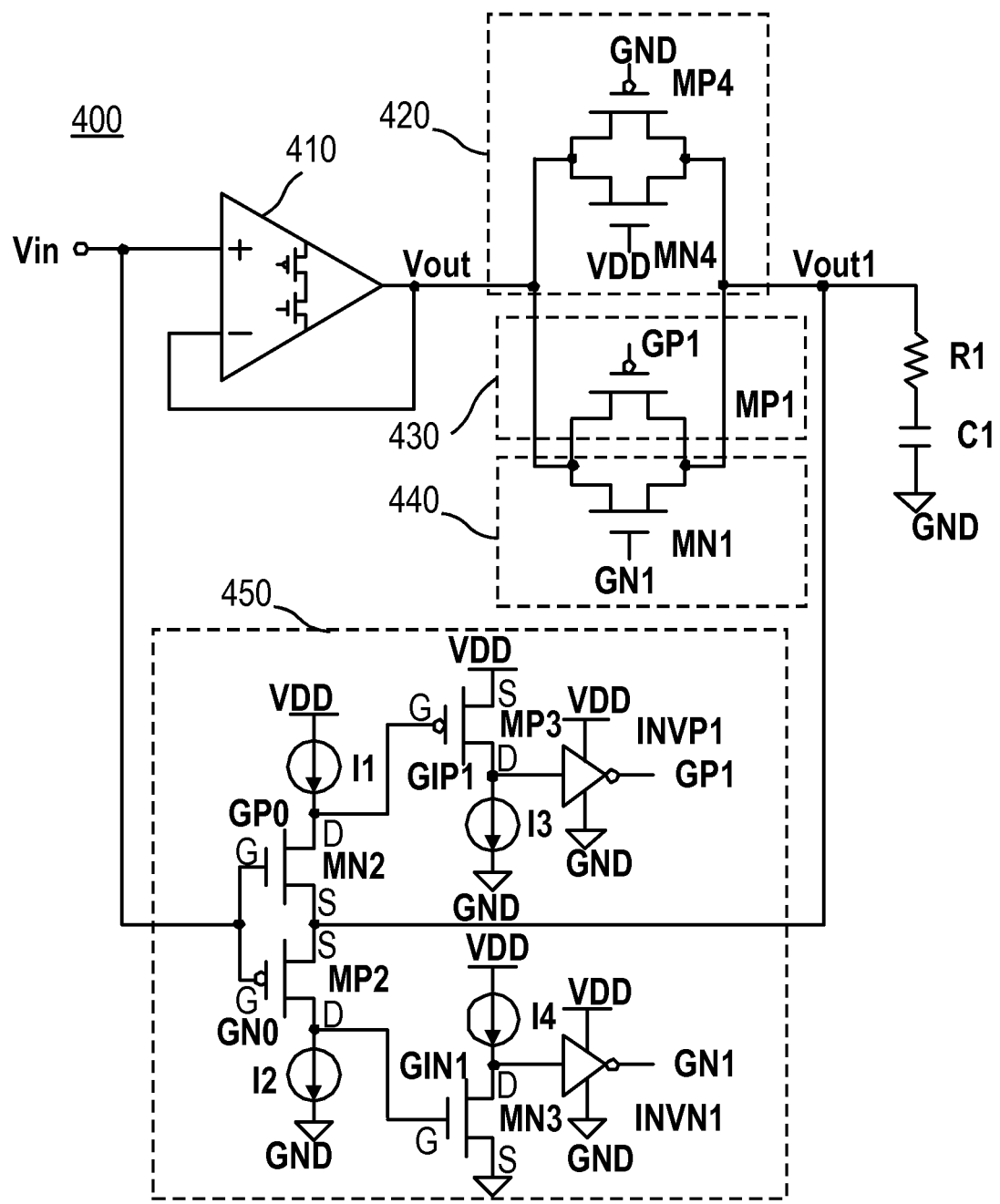
FIG. 4 is a circuit diagram of an operational amplifying device with auto-adjustment output impedance according to an embodiment of the present invention.

FIG. 4 is a circuit diagram of an operational amplifying device 400 with auto-adjustment output impedance according to an embodiment of the present invention. The device 400 includes an operational amplifier 410, a first signal path 420, a second signal path 430, a third signal path 440, and a control circuit 450.

The operational amplifier 410 has an output Vout connected to its inverting input (−), and a non-inverting input (+) for receiving an input signal Vin.

The first signal path 420 has high impedance, and has one end connected to the output Vout and the other end connected to a first output node Vout1. The first signal path 420 is comprised of a fourth PMOS transistor MP4 and a fourth NMOS transistor MN4. The fourth PMOS transistor MP4 has a gate connected to a low voltage GND, and the fourth NMOS transistor MN4 has a gate connected to a high voltage VDD, so as to normally turn on the first signal path 420.

The second signal path 430 has low impedance, and has one end connected to the output Vout and the other end connected to the first output node Vout1.

The third signal path 440 has low impedance, and has one end connected to the output Vout and the other end connected to the first output node Vout1.

The first signal path 420 is normally turned on, but the second and the third signal paths 430 and 440 are normally turned off. The second signal path 430 is comprised of a first PMOS transistor MP1, and the third signal path 440 is comprised of a first NMOS transistor MN1.

When the input signal Vin is at a rising edge, the second signal path 430 is turned on to produce low impedance between the output Vout and the first output node Vout1. When the input signal Vin is at a falling edge, the third signal path 440 is turned on to produce low impedance between the output Vout and the first output node Vout1.

The control circuit 450 is connected to the non-inverting input (+), the second signal path 430, the third signal path 440, and the first output node Vout1 for controlling the second signal path 430 and the third signal path 440 to be on or off, respectively, according to the voltages of the output Vout and the first output node Vout1.

As shown in FIG. 4, the control circuit 450 is comprised of a second NMOS transistor MN2, a second PMOS transistor MP2, a third NMOS transistor MN3, a third PMOS transistor MP3, a first current source I1, a second current source I2, a third current source I3, a fourth current source I4, a first inverter invp1, and a second inverter INVN1.

The second NMOS transistor MN2 has a gate G connected to the non-inverting input (+), and a source S connected to the first output node Vout1. The first current source I1 has one end connected to a high voltage VDD and the other end connected to a drain D of the second NMOS transistor MN2 and a gate G of the third PMOS transistor MP3. The third PMOS transistor MP3 has a source S connected to the high voltage VDD. The third current source I3 has one end connected to a drain D of the third PMOSO transistor MP3, and the other end connected to a low voltage GND. The first inverter INVP1 has an input connected to the drain D of the third PMOS transistor MP3 and an output connected to a gate of the first PMOS transistor MP1 for outputting a first control signal GP1.

The second PMOS transistor MP2 has a gate G connected to the non-inverting input (+), and a source S connected to the first output node Vout1. The second current source I2 has one end connected to the low voltage GND, and the other end connected to a drain of the second PMOS transistor MP2 and a gate G of the third NMOS transistor MN3. The third NMOS transistor MN3 has a source S connected to the low voltage GND. The fourth current source I4 has one end connected to a drain D of the third NMOS transistor MN3, and the other end connected to the high voltage VDD. The second inverter INVN1 has an input connected to the drain D of the third NMOS transistor MN3, and an output connected to a gate G of the first NMOS transistor MN1 for outputting a second control signal.

Figure 5:
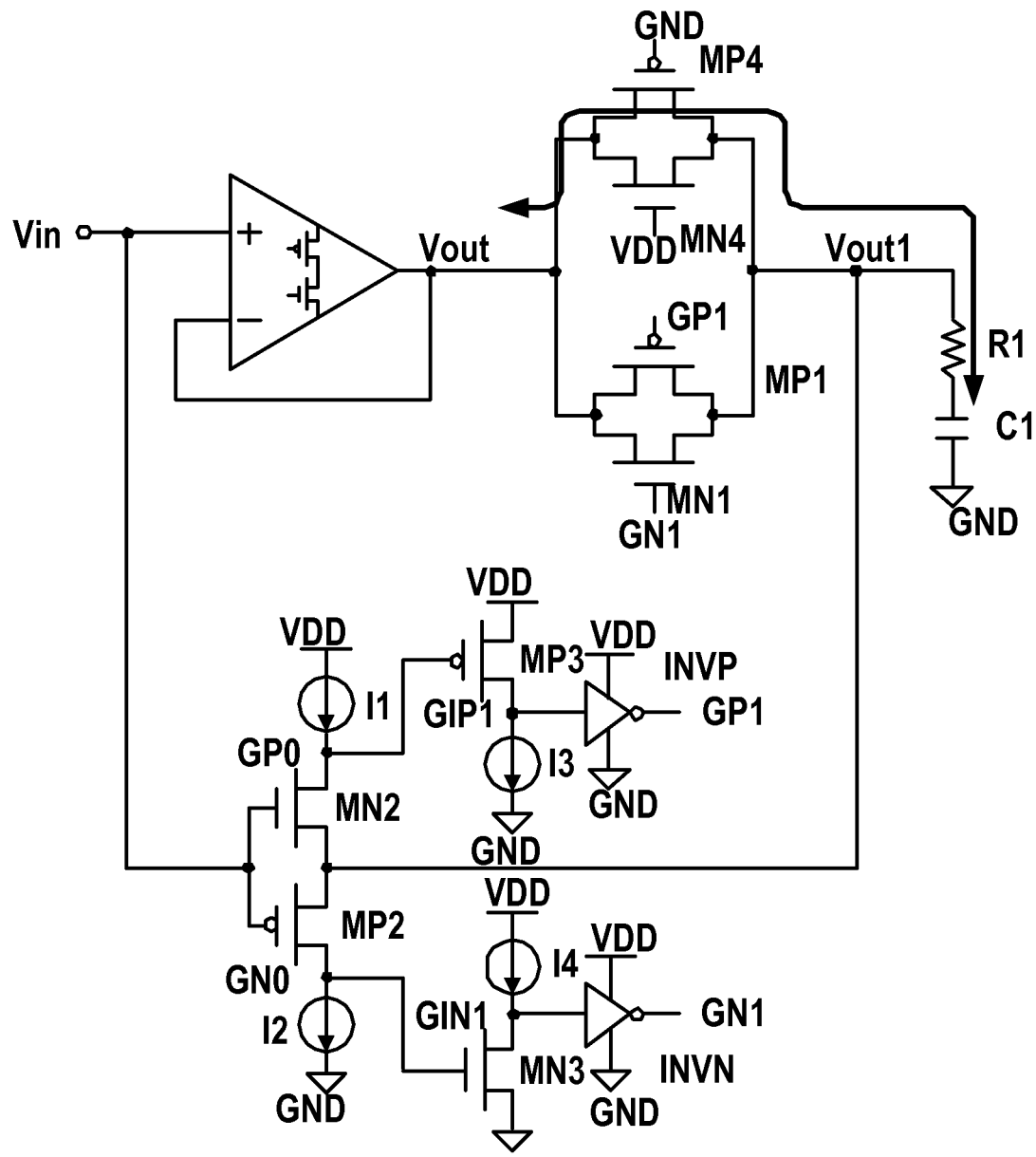
FIG. 5 is a schematic diagram of the operational amplifying device in a steady state according to the present invention.

FIG. 5 is a schematic diagram of the present operational amplifying device in a steady state according to the invention. The fourth PMOS transistor MP4 and the fourth NMOS transistor MN4 are each a high impedance switch while the first PMOS transistor MP1 and the first NMOS transistor MN1 are each a low impedance switch. As shown in FIG. 5, when the input signal Vin is in a steady state, the signal path is the high impedance path, and the fourth PMOS transistor MP4 and the fourth NMOS transistor NM4 are turned on.

Figure 6:
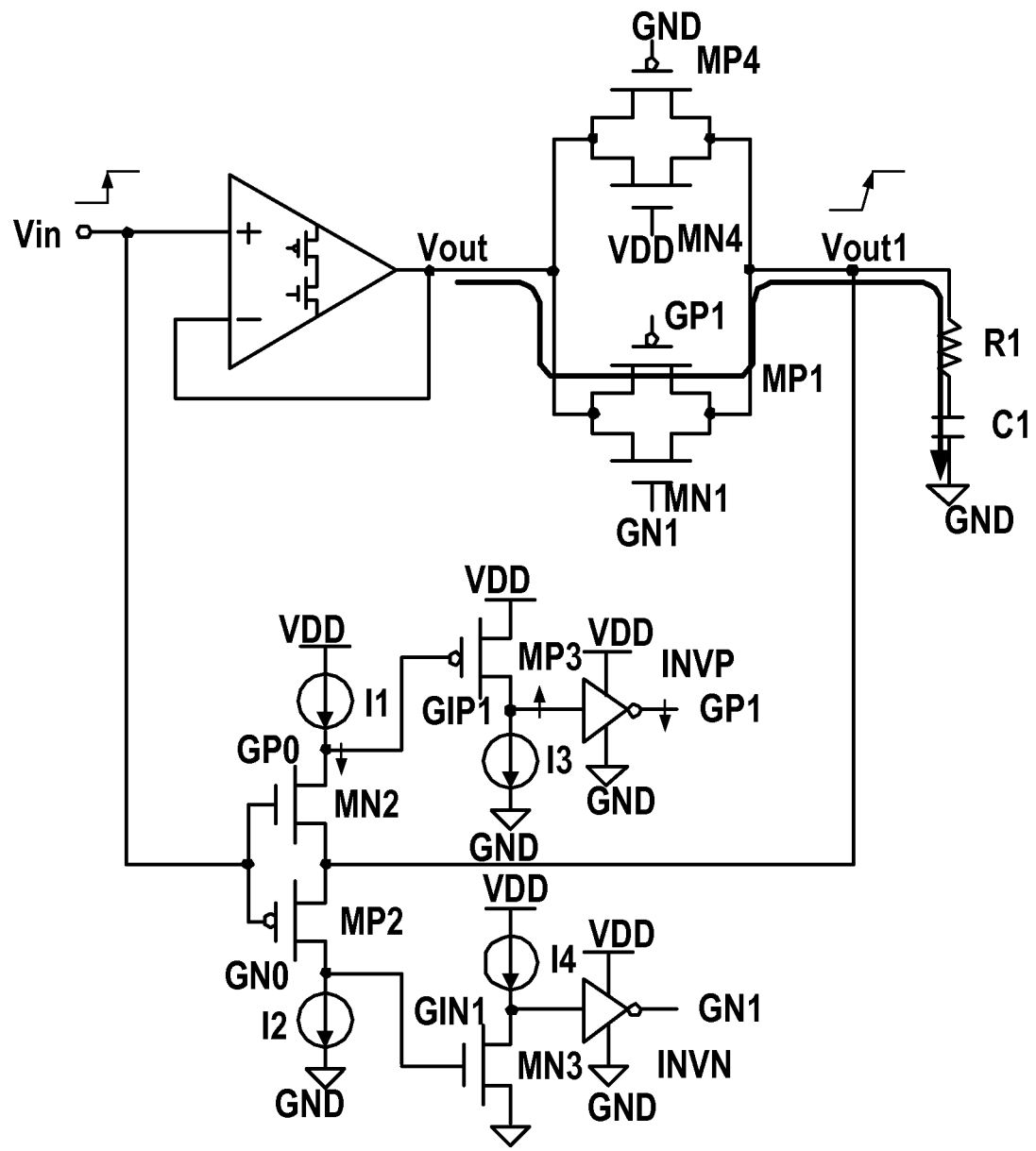
FIG. 6 is a schematic diagram of the operational amplifying device with a rising-edge input signal according to the present invention.

FIG. 6 is a schematic diagram of the present operational amplifying device with a rising-edge input signal according to the invention. As shown in FIG. 6, when the input signal Vin is at a rising edge, the second NMOS transistor MN3 is turned on to pull down the voltage of its drain D, such that the third PMOS transistor MP3 is turned on to pull up the voltage of its drain D to further make the voltage of the first control signal GP1 to be the low voltage. Thus, the first PMOS transistor MP1 is turned on, and accordingly the second signal path 430 is turned on.

Since the second signal path 430 is connected to the first signal path 420 in parallel, on the viewpoint of the first output node Vout1 and the output Vout, it can be regarded as connecting high impedance and low impedance in parallel, i.e., equivalent to low impedance. Thus, for the input signal Vin at a rising-edge transition, the second signal path 430 and the first signal path 420 present the low impedance, so that the voltage of the first output node Vout1 can fast approach to the voltage of the input signal Vin.

When the input signal Vin changes from the rising edge into a steady state, the second NMOS transistor MN2 is turned off to pull up the voltage of its drain D, such that the third PMOS transistor MP3 is turned off to pull down the voltage of its drain D so as to make the voltage of the first control signal GP1 to be the high voltage. Thus, the first PMOS transistor MP1 is turned off, and accordingly the second signal path 430 is turned off.

Since the second signal path 430 is turned off, on the viewpoint of the first output node Vout1 and the output Vout, it can be regarded as high impedance. Thus, for the input signal Vin at the steady state, the second signal path 430 and the first signal path 420 present the high impedance, so that the voltage of the first output node Vout1 does not have overshoot or undershoot.

Figure 7:
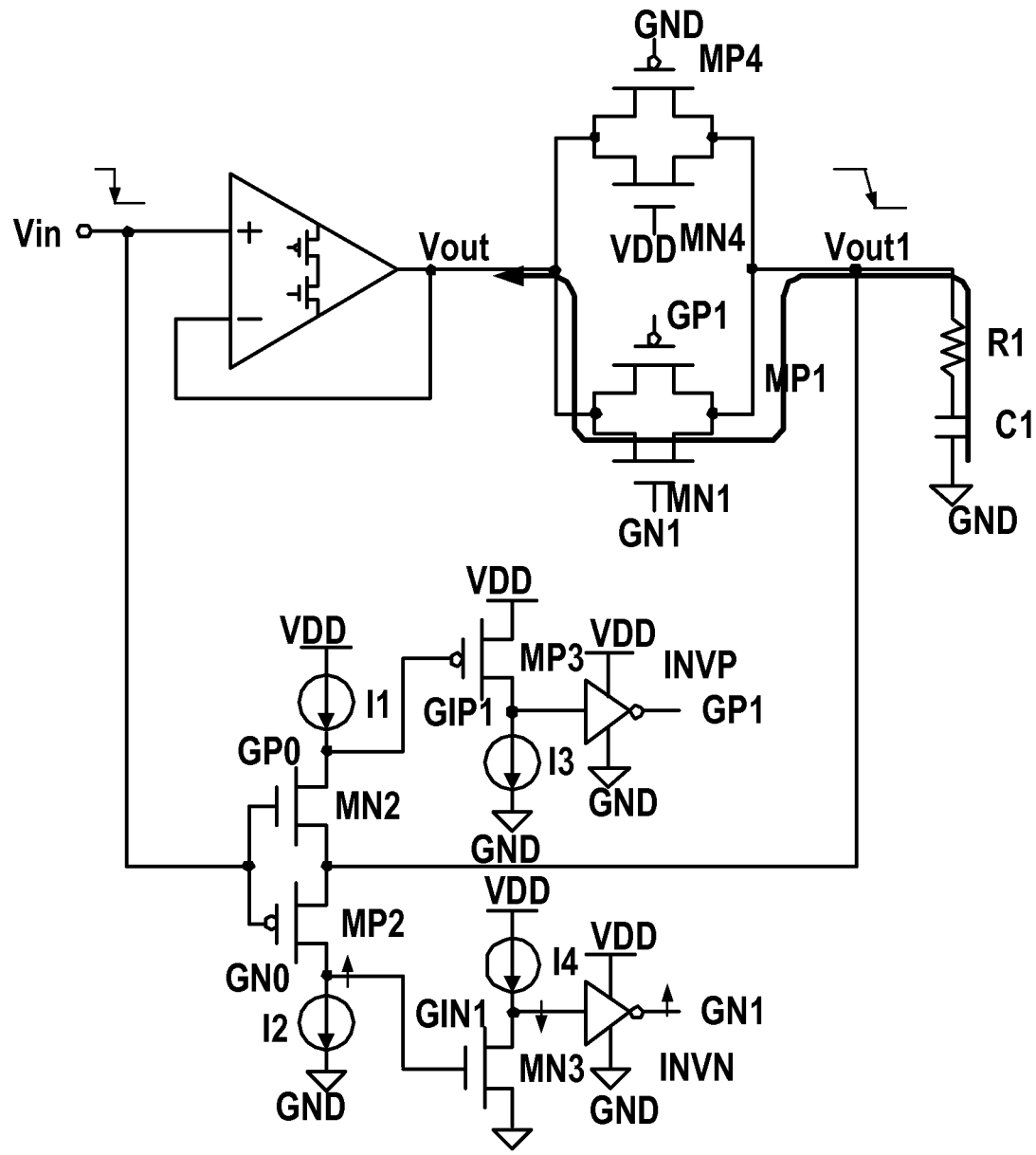
FIG. 7 is a schematic diagram of the operational amplifying device with a falling-edge input signal according to the present invention.

FIG. 7 is a schematic diagram of the present operational amplifying device with a falling-edge input signal according to the invention. As shown in FIG. 7, when the input signal Vin is at a falling edge, the second PMOS transistor MP3 is turned on to pull up the voltage of its drain D, such that the third NMOS transistor MN3 is turned on to pull down the voltage of its drain D so as to make the voltage of the second control signal GN1 to be the high voltage. Thus, the first NMOS transistor MN1 is turned on, and accordingly the third signal path 440 is turned on.

Since the third signal path 440 is connected to the first signal path 420 in parallel, on the viewpoint of the first output node Vout1 and the output Vout, it can be regarded as connecting high impedance and low impedance in parallel, i.e., equivalent to low impedance. Thus, for the input signal Vin at a falling-edge transition, the third signal path 440 and the first signal path 420 present the low impedance, so that the voltage of the first output node Vout1 can fast approach to the voltage of the input signal Vin.

When the input signal Vin is in a steady state, the second PMOS transistor MP2 is turned off to pull down the voltage of its drain D, such that the third NMOS transistor MN3 is turned off to pull up the voltage of its drain D so as to make the voltage of the second control signal GN1 to be the low voltage. Thus, the first NMOS transistor MN1 is turned off, and accordingly the third signal path 440 is turned off.

Since the third signal path 440 is turned off, on the viewpoint of the first output node Vout1 and the output Vout, it can be regarded as high impedance. Thus, for the input signal Vin at the steady state, the third signal path 440 and the first signal path 420 present the high impedance, so that the voltage of the first output node Vout1 does not have overshoot or undershoot.

Figure 8:
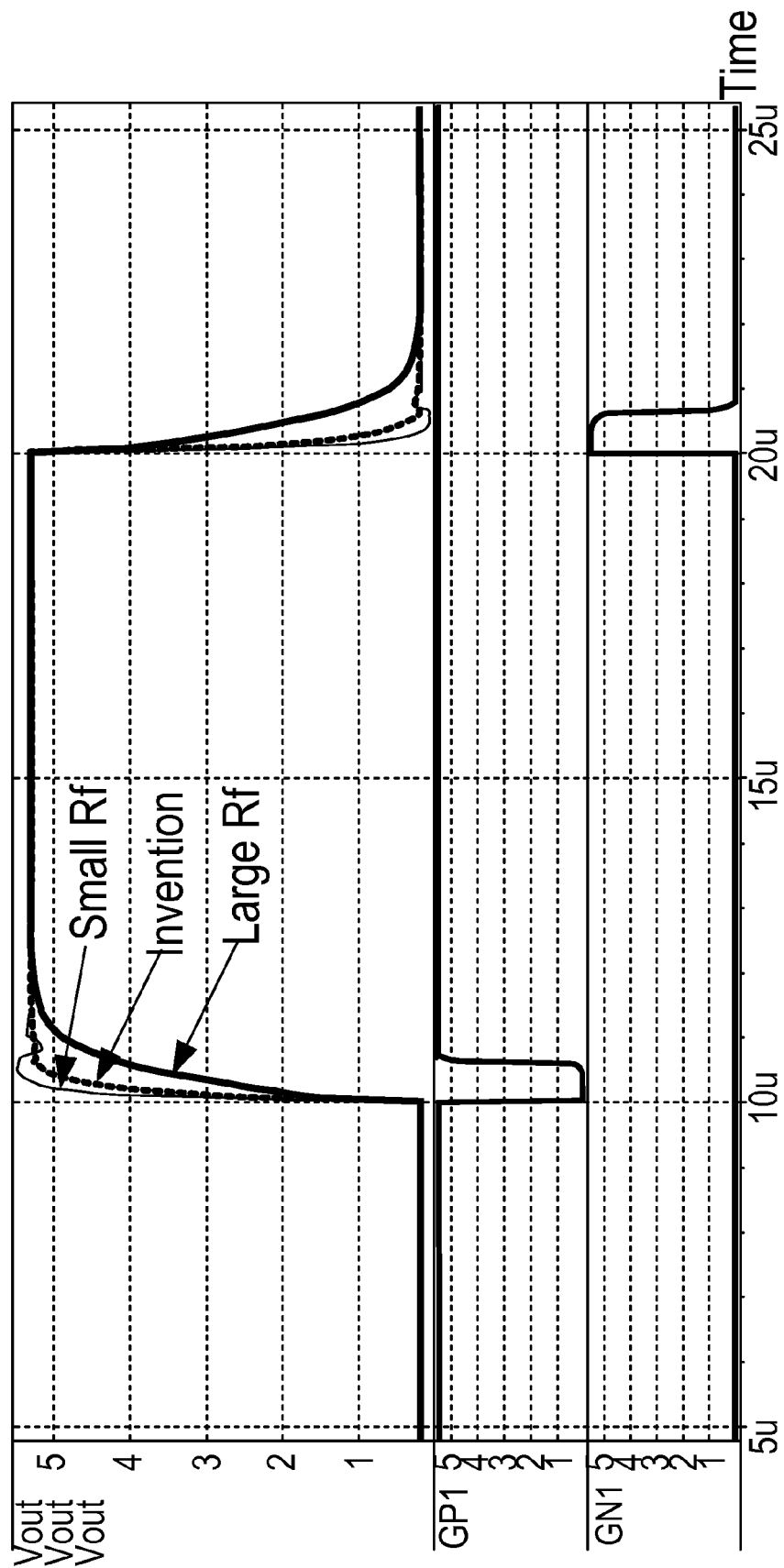
FIG. 8 is a schematic diagram of output transition waveforms of the present invention and the prior art.

FIG. 8 is a schematic graph of output transition waveforms of the invention and the prior art. As shown in FIG. 8, when the compensation resistor Rf is small, Vout outputs faster, but the overshoot and undershoot effects occur. Conversely, when the compensation resistor Rf is large, there is no overshoot or undershoot, but Vout outputs slower. However, the invention can allow Vout to output faster without the overshoot and undershoot effects. Namely, the invention is provided with a quick and steady output transition.

Figure 9:
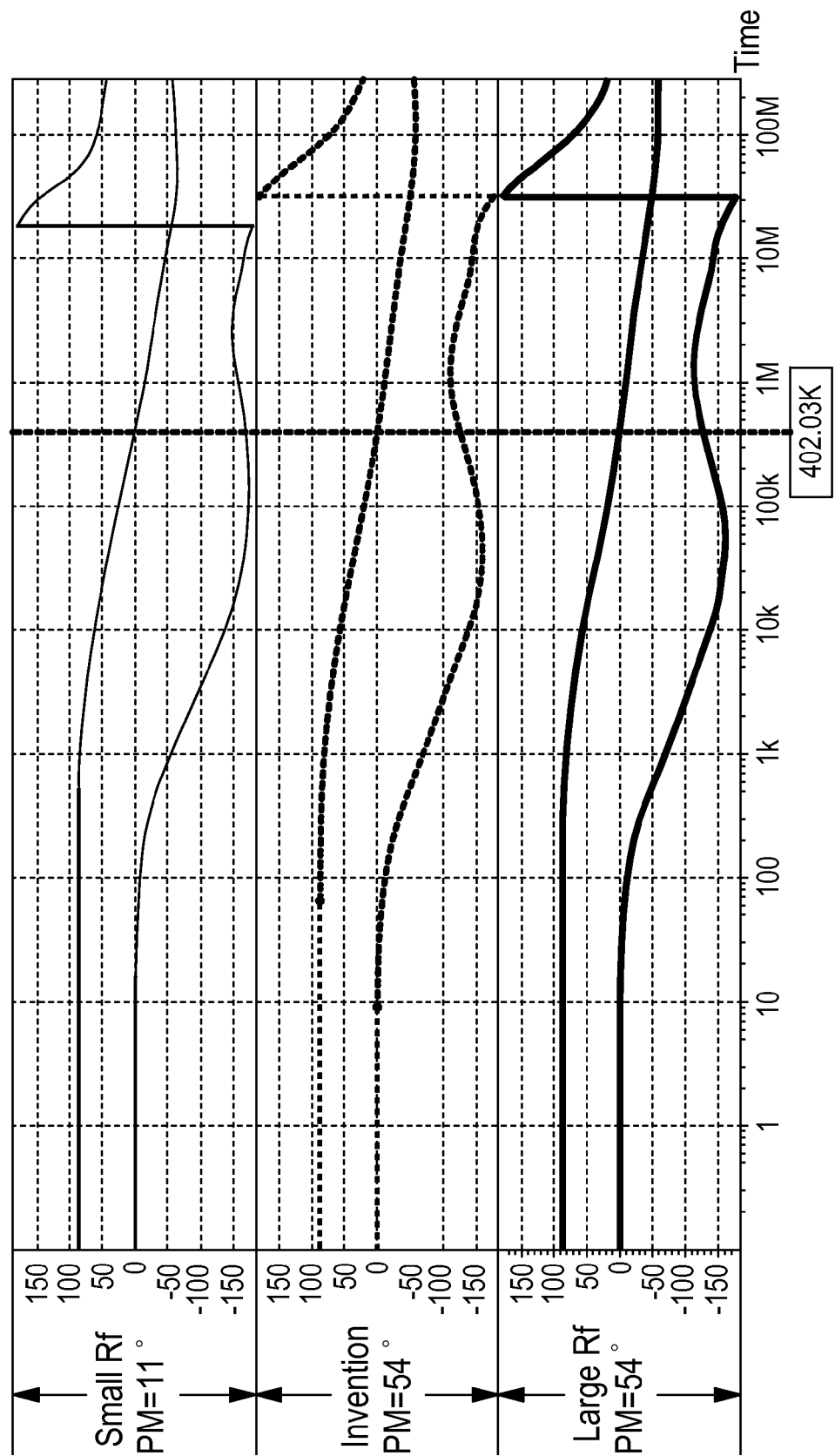
FIG. 9 is a schematic diagram of output frequency responses of the present invention and the prior art.

FIG. 9 is a schematic diagram of output frequency responses of the invention and the prior art. As shown in FIG. 9, when the compensation resistor Rf is small, the phase margin is PM=11° only, and when the compensation resistor Rf is large, the phase margin is PM=54° but the output transition is slow. In the invention, the phase margin is PM=54°, which is as steady as compensation resistor Rf being large, while the output transition is fast.

Figure 10:
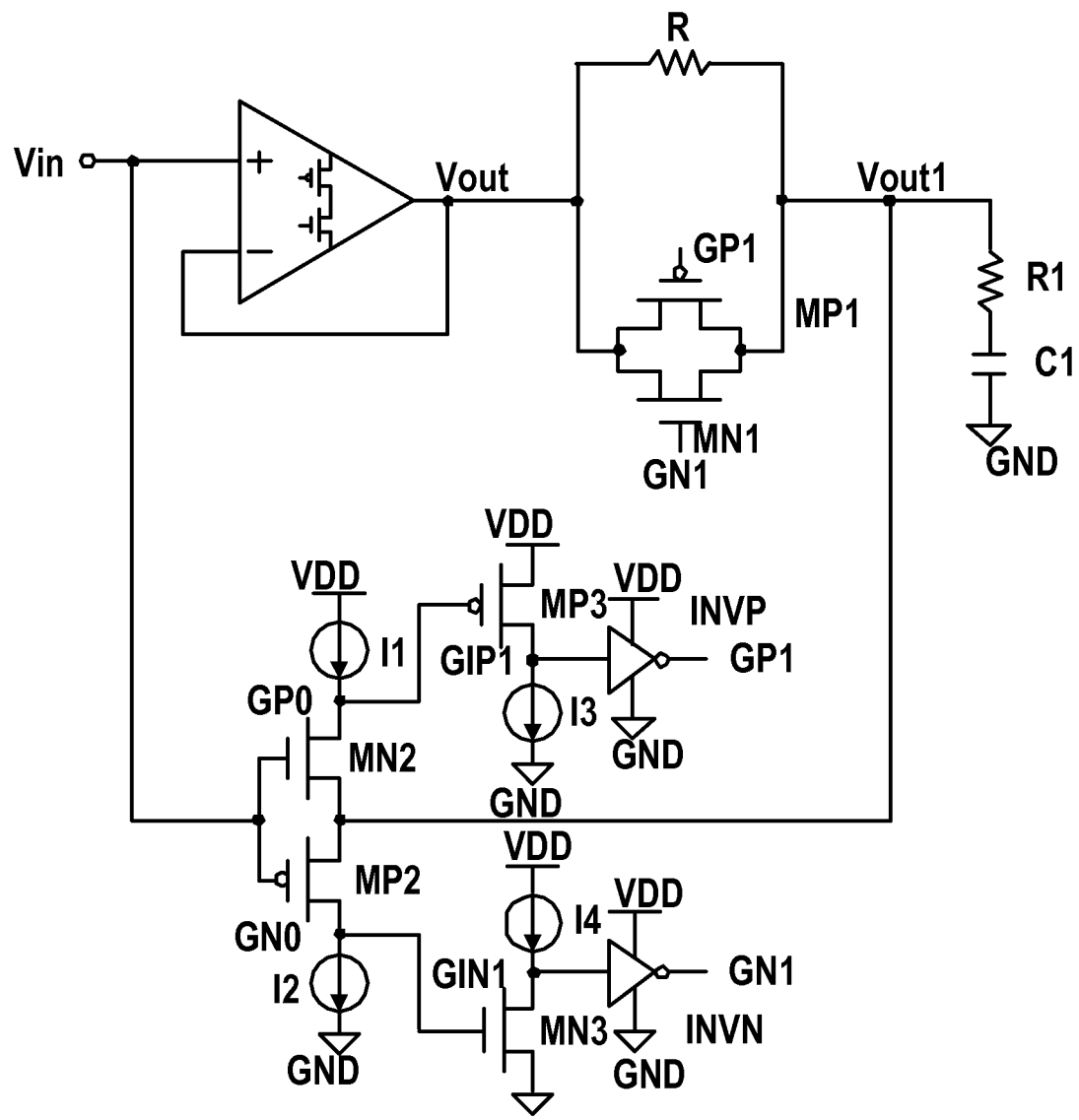
FIG. 10 is a circuit diagram of an operational amplifying device with auto-adjustment output impedance according to another embodiment of the present invention.

FIG. 10 is a circuit diagram of an operational amplifying device with auto-adjustment output impedance according to another embodiment of the present invention, which is similar to the circuit of FIG. 4 except that the first signal path 420 in FIG. 10 is comprised of a resistor, i.e., the first signal path 420 comprised of the fourth PMOS and the fourth NMOS transistors MP4 and MN4 in FIG. 4 is replaced with a high impedance resistor R. Accordingly, the signal path goes through the high impedance resistor R in the steady state to achieve the steady output effect on Vout1.

Figure 11:
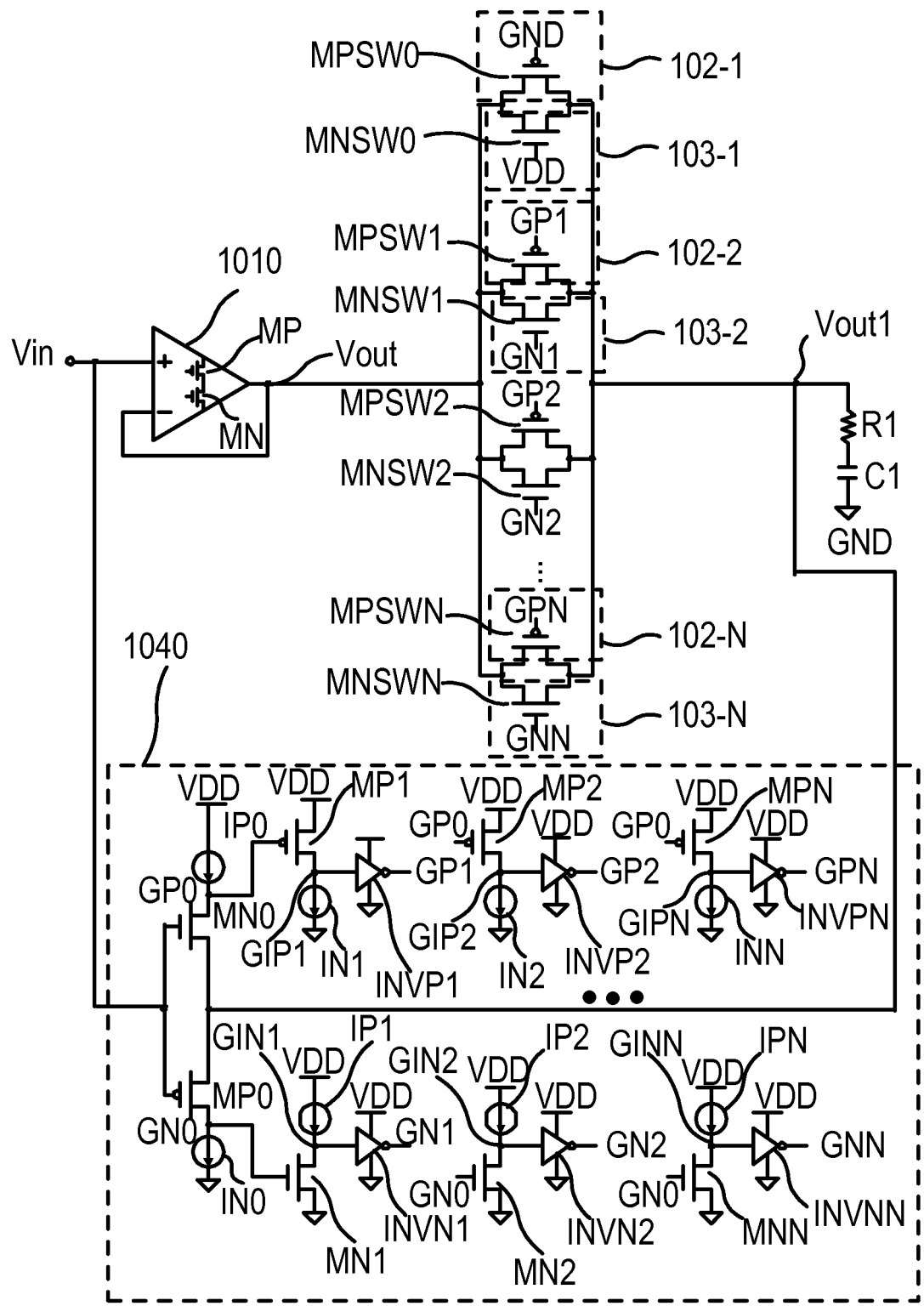
FIG. 11 is a circuit diagram of an operational amplifying device with auto-adjustment output impedance according to a further embodiment of the present invention.

FIG. 11 is a circuit diagram of an operational amplifying device with auto-adjustment output impedance according to a further embodiment of the present invention, which includes an operational amplifier 1010, 1-st to 2N-th signal paths 102-1, 102-2, ..., 102-N, 103-1, 103-2, ..., 103-N, and a control circuit 1040, where N is a natural number.

The operational amplifier 1010 has an output Vout connected to its inverting input (−) and a non-inverting input (+) for receiving an input signal Vin.

Each of the 1-st to 2N-th signal paths 102-1, 102-2, ..., 102-N, 103-1, 103-2, ..., 103-N has different impedance, and each signal path has one end connected to the output Vout of the operational amplifier and the other end connected to a first output node Vout1.

The control circuit 1040 is connected to the non-inverting input (+), the 1-st to 2N-th signal paths 102-1, 102-2, ..., 102-N, 103-1, 103-2, ..., 103-N, and the first output node Vout1 in order to control the 1-st to 2N-th signal paths 102-1, 102-2, ..., 102-N, 103-1, 103-2, ..., 103-N to be on and off, respectively, according to voltage of the output Vout and voltage of the first output node Vout1.

As shown in FIG. 11, each of the 1-st to N-th signal paths 102-1, 102-2, ..., 102-N is comprised of a PMOS transistor while each of (N+1)-th to 2N-th signal paths 103-1, 103-2, ..., 103-N is comprised of an NMOS transistor.

When the input signal Vin is at a rising edge, the control circuit 1040 sequentially turns on the 1-st to N-th signal paths 102-1, 102-2, ..., 102-N so as to produce a low impedance between the output Vout and the first output node Vout1. When the input signal Vin is at a falling edge, the control circuit 1040 sequentially turns on the (N+1)-th to 2N-th signal paths 1031, 1032, ..., 103N so as to produce low impedance between the output Vout and the first output node Vout1.

In other control ways, the 1-st signal path 1021 and the (N+1)-th signal path 1031 are normally on while the other signal paths 102-2, ..., 102-N, 103-2, ..., 103-N are normally off.

When the input signal Vin is at a rising edge, the 2-nd signal path 102-2 to the N-th signal path 102-N are all turned on, and then the control circuit 1040 sequentially turns off the 2-nd signal path 102-2 to the N-th signal path 102-N so as to produce high impedance between the output signal Vout and the first output node Vout1 when the input signal Vin is in the steady state.

Similarly, when the input signal Vin is at a falling edge, the (N+2)-th signal path 103-2 to the 2N-th signal path 103-N are all turned on, and then the control circuit 1040 sequentially turns off the (N+2)-th signal path 103-2 to the 2N-th signal path 103-N so as to produce low impedance between the output signal Vout and the first output node Vout1 when the input signal Vin is in the transition state, and to produce high impedance therebetween when the input signal Vin in the steady state.

As cited, when the non-inverting input of the operational amplifier is in the transition state, the output signal path is directed to the low impedance switch (transistors) to allow the output of the operational amplifier to fast transit its state, and when the output approaches to the steady state, the output signal path is directed to the high impedance switches to allow the output of the operational amplifier to become slow and steady.

Namely, the invention essentially uses the control circuit and two sets of transmission gate switches as the compensation resistance, i.e., one as the high impedance switch and the other as the low impedance switch, to achieve the frequency compensation. When the non-inverting input of the operational amplifier is in the transition state, the output signal path is directed to the low impedance switch to allow the output of the operational amplifier to fast change its state, and when the output approaches to the steady state, the output signal path is directed to the high impedance switch to allow the output of the operational amplifier to become slow and steady. Thus, the output of the operational amplifier can make a quick response without encountering the overshoot and undershoot effect.

Although the present invention has been explained in relation to its preferred embodiment, it is to be understood that many other possible modifications and variations can be made without departing from the spirit and scope of the invention as hereinafter claimed.

What is claimed is:

1. An operational amplifying device with auto-adjustment output impedance, comprising:
    an operational amplifier having an output connected to its inverting input, and a non-inverting input for receiving an input signal;
    a first signal path having one end connected to the output of the operational amplifier and the other end connected to a first output node;
    a second signal path having one end connected to the output of the operational amplifier and the other end connected to the first output node; and
    a third signal path having one end connected to the output of the operational amplifier and the other end connected to the first output node,
    wherein the first signal path is normally on, the second signal path and the third signal path are normally off, the first signal path has high impedance, and each of the second signal path and the third signal path has low impedance; and
    wherein the second signal path is turned on to produce the low impedance between the output of the operational amplifier and the first output node when the input signal is at a rising edge.

2. The operational amplifying device with auto-adjustment output impedance as claimed in claim 1, wherein the third signal path is turned on to produce the low impedance between the output of the operational amplifier and the first output node when the input signal is at a falling edge.

3. The operational amplifying device with auto-adjustment output impedance as claimed in claim 1, further comprising a control circuit connected to the non-inverting input, the second signal path, the third signal path, and the first output node for controlling the second signal path and the third signal path to be on or off, respectively, according to voltage of the output of the operational amplifier and a voltage of the first output node.

4. The operational amplifying device with auto-adjustment output impedance as claimed in claim 3, wherein the second signal path is comprised of a first PMOS transistor, and the third signal path is comprised of a first NMOS transistor.

5. The operational amplifying device with auto-adjustment output impedance as claimed in claim 4, wherein the control circuit is comprised of a second NMOS transistor, a second PMOS transistor, a third NMOS transistor, a third PMOS transistor, a first current source, a second current source, a third current source, a fourth current source, a first inverter, and a second inverter.

6. The operational amplifying device with auto-adjustment output impedance as claimed in claim 5, wherein the second NMOS transistor has a gate connected to the non-inverting input and a source connected to the first output node, the first current source has one end connected to a high voltage and the other end connected to a drain of the second NMOS transistor and a gate of the third PMOS transistor, the third PMOS transistor has a source connected to the high voltage, the third current source has one end connected to a drain of the third PMOS transistor and the other end connected to a low voltage, the first inverter has an input connected to the drain of the third PMOS transistor and an output connected to a gate of the first PMOS transistor for outputting a first control signal.

7. The operational amplifying device with auto-adjustment output impedance as claimed in claim 6, wherein the second PMOS transistor has a gate connected to the non-inverting input and a source connected to the first output node, the second current source has one end connected to the low voltage and the other end connected to a drain of the second PMOS transistor and a gate of the third NMOS transistor, the third NMOS transistor has a source connected to the low voltage, the fourth current source has one end connected to a drain of the third NMOS transistor and the other end connected to the high voltage, the second inverter has an input connected to the drain of the third NMOS transistor and an output connected to a gate of the first NMOS transistor for outputting a second control signal.

8. The operational amplifying device with auto-adjustment output impedance as claimed in claim 7, wherein, when the input signal is at the rising edge, the second NMOS transistor is turned on to pull down voltage of the drain thereof so as to turn on the third PMOS transistor, and voltage of the drain of the third PMOS transistor is pulled up, such that voltage of the first control signal becomes the low voltage to turn on the first PMOS transistor and further turn on the second signal path.

9. The operational amplifying device with auto-adjustment output impedance as claimed in claim 8, wherein, when the input signal is in a steady state, the second NMOS transistor is turned off to pull up the voltage of the drain thereof so as to turn off the third PMOS transistor, and the voltage of the drain of the third PMOS transistor is pulled down, such that the voltage of the first control signal becomes the high voltage to turn off the first PMOS transistor and further turn off the second signal path.

10. The operational amplifying device with auto-adjustment output impedance as claimed in claim 9, wherein, when the input signal is at the falling edge, the second PMOS transistor is turned on to pull up voltage of the drain thereof so as to turn on the third NMOS transistor, and voltage of the drain of the third NMOS transistor is pulled down, such that voltage of the second control signal becomes the high voltage to turn on the first NMOS transistor and further turn on the third signal path.

11. The operational amplifying device with auto-adjustment output impedance as claimed in claim 8, wherein, when the input signal is in the steady state, the second PMOS transistor is turned off to pull down the voltage of the drain thereof so as to turn off the third NMOS transistor, and the voltage of the drain of the third NMOS transistor is pulled up, such that the voltage of the second control signal becomes the low voltage to turn off the first NMOS transistor and further turn off the third signal path.

12. The operational amplifying device with auto-adjustment output impedance as claimed in claim 1, wherein the first signal path is comprised of a fourth PMOS transistor and a fourth NMOS transistor, the fourth PMOS transistor has a gate connected to the low voltage, and the fourth NMOS transistor has a gate connected to the high voltage, such that the first signal path is normally on.

13. The operational amplifying device with auto-adjustment output impedance as claimed in claim 1, wherein the first signal path is comprised of a resistor.

14. An operational amplifying device with auto-adjustment output impedance, comprising:

an operational amplifier having an output connected to its inverting input, and a non-inverting input for receiving an input signal;

1-st to 2N-th signal paths having different impedance, each signal path having one end connected to the output of the operational amplifier and the other end connected to a first output node; and a control circuit connected to the non-inverting input, the 1-st to 2N-th signal paths, and the first output node for controlling the 1-st to 2N-th signal paths to be on or off, respectively, according to voltage of the output of the operational amplifier and voltage of the first output node, wherein each of the 1-st to N-th signal paths is comprised of a PMOS transistor while each of the (N+1)-th to 2N-th signal paths is comprised of an NMOS transistor; and wherein, when the input signal is at a rising edge, the control circuit sequentially turns on the 1-st signal path to the N-th signal path so as to produce low impedance between the output of the operational amplifier and the first output node.

15. The operational amplifying device with auto-adjustment output impedance as claimed in claim 14, wherein, when the input signal is at a falling edge, the control circuit sequentially turns on the (N+1)-th signal path to the 2N-th signal path to produce low impedance between the output of the operational amplifier and the first output node.

16. The operational amplifying device with auto-adjustment output impedance as claimed in claim 14, wherein the 1-st signal path and the (N+1)-th signal path are normally on while the other signal paths are normally off.

17. The operational amplifying device with auto-adjustment output impedance as claimed in claim 16, wherein, when the input signal is at a rising edge, the 2-nd signal path to the N-th signal path are all turned on, and then the control circuit sequentially turns off the 2-nd signal path to the N-th signal path so as to produce low impedance between the output of the operational amplifier and the first output node when the input signal in a transition state, and to produce high impedance therebetween when the input signal in a steady state.

18. The operational amplifying device with auto-adjustment output impedance as claimed in claim 16, wherein, when the input signal is at a falling edge, the (N+2)-th signal path to the 2N-th signal path are all turned on, and then the control circuit sequentially turns off the (N+2)-th signal path to the 2N-th signal path so as to produce low impedance between the output of the operational amplifier and the first output node when the input signal in a transition state, and to produce high impedance therebetween when the input signal in a steady state.

19. An operational amplifying device with auto-adjustment output impedance, comprising:

an operational amplifier having an output connected to its inverting input, and a non-inverting input for receiving an input signal;

a first signal path having one end connected to the output of the operational amplifier and the other end connected to a first output node;

a second signal path having one end connected to the output of the operational amplifier and the other end connected to the first output node;

a third signal path having one end connected to the output of the operational amplifier and the other end connected to the first output node; and a control circuit connected to the non-inverting input, the second signal path, the third signal path, and the first output node for controlling the second signal path and the third signal path to be on or off, respectively, according to voltage of the output of the operational amplifier and a voltage of the first output node, wherein the first signal path is normally on, the second signal path and the third signal path are normally off, the first signal path has high impedance, and each of the second signal path and the third signal path has low impedance;

wherein the second signal path is comprised of a first PMOS transistor, and the third signal path is comprised of a first NMOS transistor, the control circuit is comprised of a second NMOS transistor, a second PMOS transistor, a third NMOS transistor, a third PMOS transistor, a first current source, a second current source, a third current source, a fourth current source, a first inverter, and a second inverter.

* * * * *